(12) United States Patent
Jahnke et al.

(10) Patent No.: US 7,939,224 B2
(45) Date of Patent: May 10, 2011

(54) MASK WITH REGISTRATION MARKS AND METHOD OF FABRICATING INTEGRATED CIRCUITS

(75) Inventors: Andreas Jahnke, Radebeul (DE); Ralf Ziebold, Radebeul (DE); Torsten Maehr, Dresden (DE)

(73) Assignee: Qimonda AG, Munich (DE)

( * ) Notice: Subject to any disclaimer, the term of this patent is extended or adjusted under 35 U.S.C. 154(b) by 698 days.

(21) Appl. No.: 11/855,234

(22) Filed: Sep. 14, 2007

(65) Prior Publication Data

US 2009/0075178 A1    Mar. 19, 2009

(51) Int. Cl.
*G03F 1/00* (2006.01)
*G03C 5/00* (2006.01)
(52) U.S. Cl. .............. 430/5; 430/311; 430/394
(58) Field of Classification Search .......... 430/5, 311, 430/394; 250/559.3; 257/798
See application file for complete search history.

(56) References Cited

U.S. PATENT DOCUMENTS

| | | | |
|---|---|---|---|
| 5,242,770 A * | 9/1993 | Chen et al. ................. | 430/5 |
| 6,300,018 B1 * | 10/2001 | Dilley et al. ............... | 430/5 |
| 6,323,560 B1 * | 11/2001 | Narimatsu et al. ......... | 257/798 |
| 6,842,538 B2 | 1/2005 | Lee et al. | |
| 2002/0031712 A1 * | 3/2002 | Tani ........................ | 430/5 |
| 2002/0079467 A1 * | 6/2002 | Udagawa et al. .......... | 250/559.3 |
| 2007/0105024 A1 * | 5/2007 | Rankin et al. ............. | 430/5 |

* cited by examiner

*Primary Examiner* — Mark F. Huff
*Assistant Examiner* — Rashid Alam
(74) *Attorney, Agent, or Firm* — Edell, Shapiro & Finnan, LLC

(57) ABSTRACT

A photomask for a lithography apparatus includes a chip pattern configured to be transferred into a resist layer on a workpiece and at least one registration mark that is configured not to be transferred into the resist layer. Mask qualification may be improved without impacting wafer level processes.

24 Claims, 9 Drawing Sheets

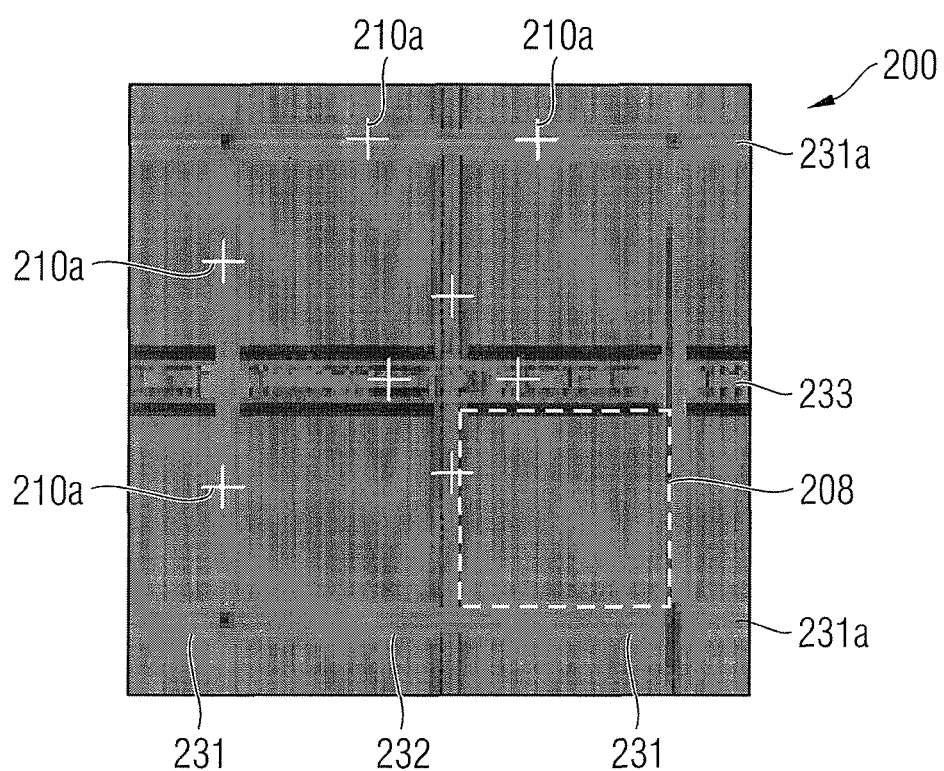

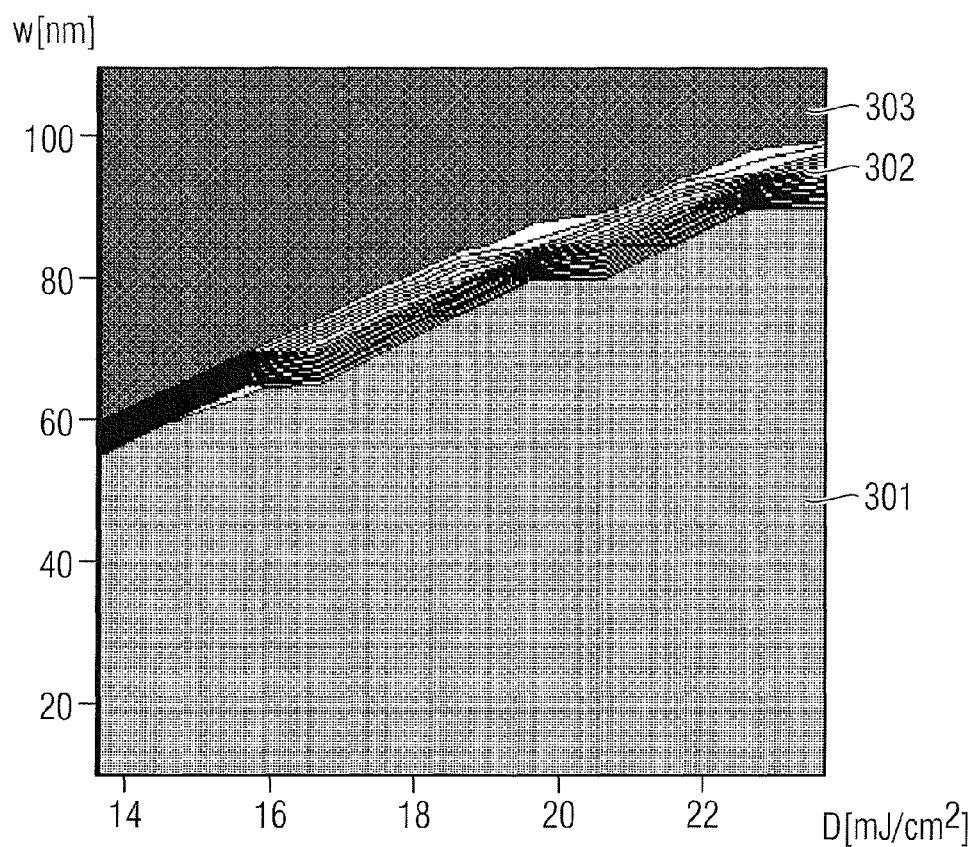

MASK WITH REGISTRATION MARKS AND METHOD OF FABRICATING INTEGRATED CIRCUITS

BACKGROUND

The manufacture and fabrication of semiconductor devices involve lithography processes transferring a mask pattern into a resist layer that covers a semiconductor wafer and that is sensitive to the exposure illumination. In the semiconductor wafer, structures are formed in a plurality of layers, wherein the structures in the various layers have to be aligned to each other. The dimensions of the patterns and the spaces between the patterns must be provided with sufficient tolerance versus a misalignment of the various layers with reference to each other. Each layer may therefore include alignment marks, wherein the alignment marks of different layers have a predetermined relationship to each other when they are correctly registered.

An example of an alignment mark is a box-in-box mark, wherein an outer box is formed in a first layer and a smaller inner box is formed in a second layer. When the two boxes are concentric, the layers are accurately registered, meaning that the masks and the semiconductor wafer have been perfectly aligned to each other in the respective illumination process step. Any alignment error produces a displacement of the boxes relative to each other. Further, the overlay tolerance has to consider displacement errors of mask structures relative to each other. Typically, alignment marks are used also as registration marks to survey or measure the mask pattern on the mask. If the positions of the registration marks on the mask meet a predetermined specification and their displacement from a respective target position is within an allowable tolerance range, the mask patterns may be provided with a lower tolerance versus an alignment error and the performance of devices emerging from the structures on the semiconductor wafer and/or the yield may be improved.

A need exists for photomasks and methods of fabricating integrated circuits facilitating the manufacturing of integrated circuits with improved device performance and/or improved yield.

SUMMARY

A photomask comprising a registration mark is described herein. According to an exemplary embodiment, a photomask for a lithography apparatus comprises a chip pattern configured to be transferred into a resist layer on a workpiece and at least one registration mark that is configured not to be transferred into the resist layer. Mask qualification may be improved without impact on wafer level process.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Features and advantages of exemplary embodiments will be apparent from the following description with reference to the accompanying drawings. The drawings are not necessarily to scale. Emphasis is placed upon illustrating the principles.

FIG. 2B is a schematic plan view of a section of a mask comprising a plurality of registration marks as shown in FIG. 2A.

FIG. 3A is a diagram for illustrating the illumination conditions for sub-resolution registration marks for phase shifting masks according to an exemplary embodiment.

DETAILED DESCRIPTION

Figure 1A:
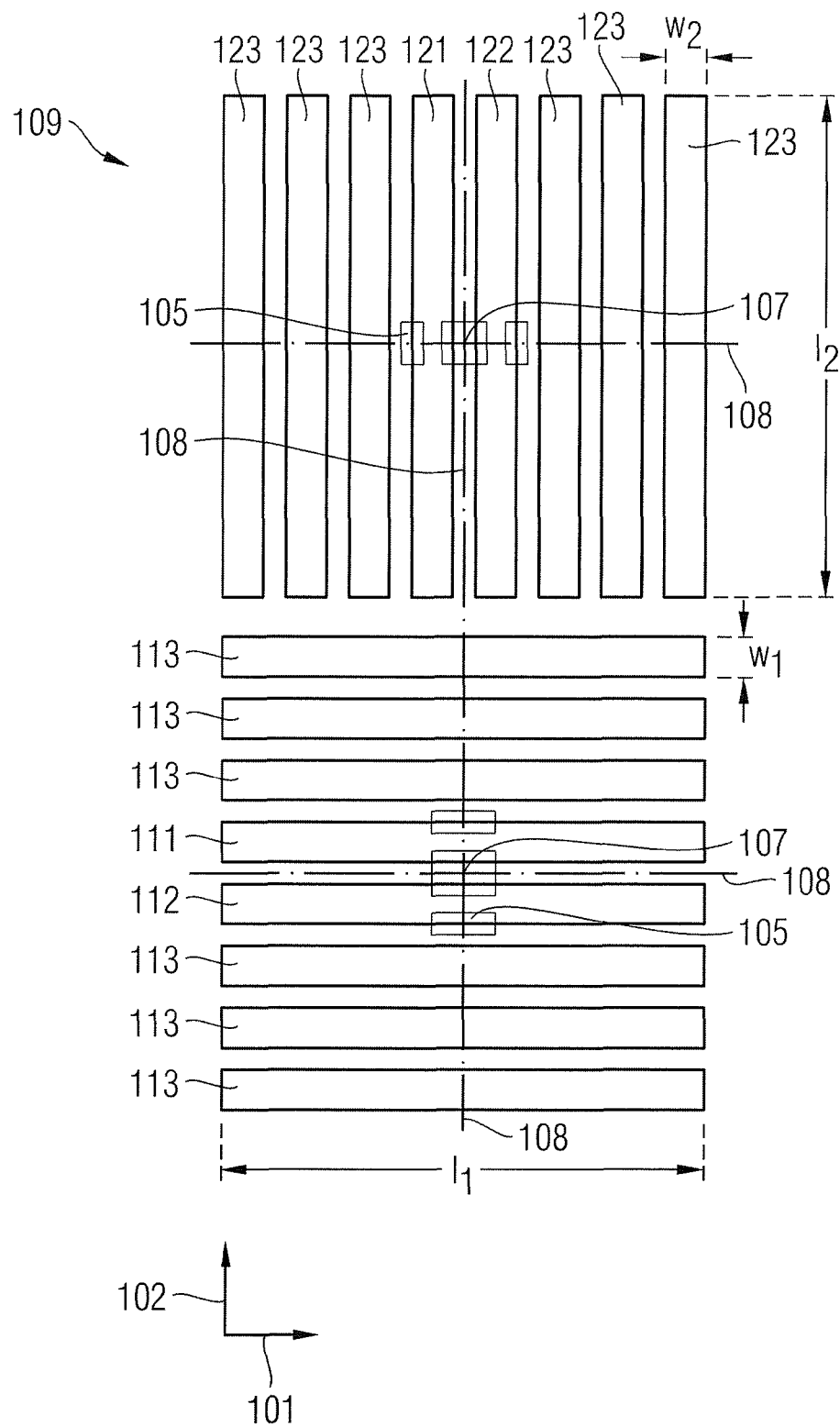
FIG. 1A is a schematic plan view of a registration mark comprising a plurality of line elements arranged in a zebra pattern according to an exemplary embodiment.

A photomask comprising a registration mark is described herein. FIG. 1A refers to a mask, for example a photomask or a reticle or a reflective mask, comprising a registration mark 109 comprising a plurality of parallel line elements according to an exemplary embodiment. The positions of a plurality of registration marks are measured with respect to each other to characterize their positions. The term "registration mark" as used in the following refers to mask structures that are used to qualify the mask. A registration mark 109 may comprise a first line element 111. The first line element 111 may be a straight line extending along a first axis 101 with a first width w1 and a first length l1. The registration mark 109 may further comprise a second line element 121 which may also be a straight line. The second line element 121 may extend along a second axis 102 that intersects the first axis 101. According to an exemplary embodiment, the second axis 102 is perpendicular to the first axis 101. A second width w2 of the second line element 121 may correspond essentially to the first width w1 and a second length l2 of the second line element 121 may correspond essentially to the first length l1 of the first line element 111. In accordance with a further embodiment, the registration mark 109 may further comprise a further first line element 112 extending along the first axis 101 and a further second line element 122 extending along the second axis 102. The position of the registration mark 109 on the mask 109 may be measured by capturing an image of the mask or a section of the mask and scanning the image for the predefined registration mark 109. Once the registration marks 109 are found, their contours are extracted from the image data and position, scale and orientation of each registration mark 109 can be determined.

The process of mark detection and location may be comparably simple if the marks are well defined and the images have high contrasts but low noise, for example, mark detection can be accomplished by a correlation method. Determining position and scale of the registration mark 109 may therefore include detecting and locating the registration mark. According to an embodiment, a center 107 and symmetry axes 108 of the registration mark 109 or portions of the registration mark 109 may be identified. Within evaluation areas 105, an optical registration tool may determine the edges of, for example, the first line elements 111, 112. An arithmetic mean value of the distance between the edges and a reference point may define a position of the registration mark 109 at the second axis 102.

Within evaluation areas 105 overlapping the second line elements 121, 122, the optical registration tool may determine the edges of the second line elements 121, 122 via the contrast information. A mean value may define a position of the registration mark 109 along the first axis 101. Evaluation of further first line elements 113 and further second line elements 123 may be included to determine more reliable mean values.

The widths w1, w2 of the line elements 111, 112, 113, 121, 122, 123 are selected such that the registration mark 109 is not imaged into a resist layer on a workpiece during a lithography process imaging a chip pattern on the same mask into the resist layer. Besides the illumination wave length, the widths w1, w2 may depend on the exposure dose and the defocus. As the registration marks 109 are not printed on the workpiece, which may be, for example a semiconductor wafer for fabricating integrating circuits, the registration marks 109 do not have an impact on wafer level, whereas conventional registration marks which are printed on the wafer, may have limited applicability. As these registration marks 109 are typically bigger than the chip pattern structures, etching and polishing processes may be far from optimized conditions. Therefore falling lines or over-etched regions may occur on wafer level. Under certain conditions, these registration marks may even contaminate the wafer with particles. Other than sub-resolution assist features which are used to support imaging of the chip pattern by using optical proximity effects, a registration mark 109 keeps a distance to the chip pattern, which ensures that no interaction between the chip pattern and the registration mark occurs and that optical proximity effects induced by the registration marks 109 are avoided.

Figure 1B:
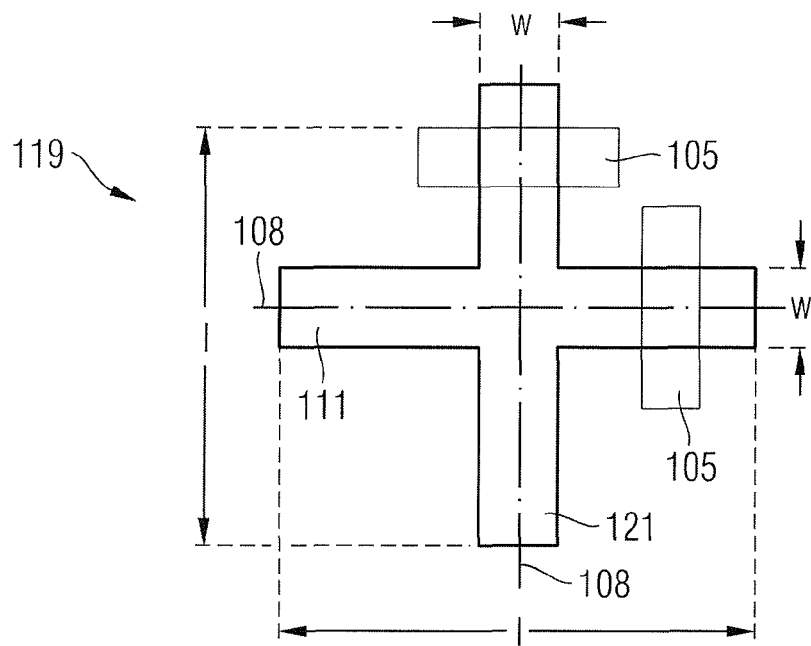
FIG. 1B is a plan view of a cross-shaped registration mark according to a further embodiment.

FIG. 1B shows a further space effective registration mark 119 which has the shape of a cross. A first line element 111 extends along a first axis 101 and a second line element 121 intersects the first line element 111, for example perpendicularly. In accordance with an exemplary embodiment, the first and second line elements 111, 121 have the same width w and the same length l, wherein the width w is below the nominal resolution limit of the used lithography process, for example between about 250 nm and about 400 nm at an illumination wavelength of 193 nm and a scale ratio of 4:1 between mask and wafer dimensions. The length l of the line elements 111, 121 may be greater than the nominal resolution limit to facilitate automatic optical pattern recognition, for example between 10 μm and 30 μm. Both the first line element 111 and the second line element 121 may be evaluated in one or two evaluation regions 105, by way of example.

Figure 1C:
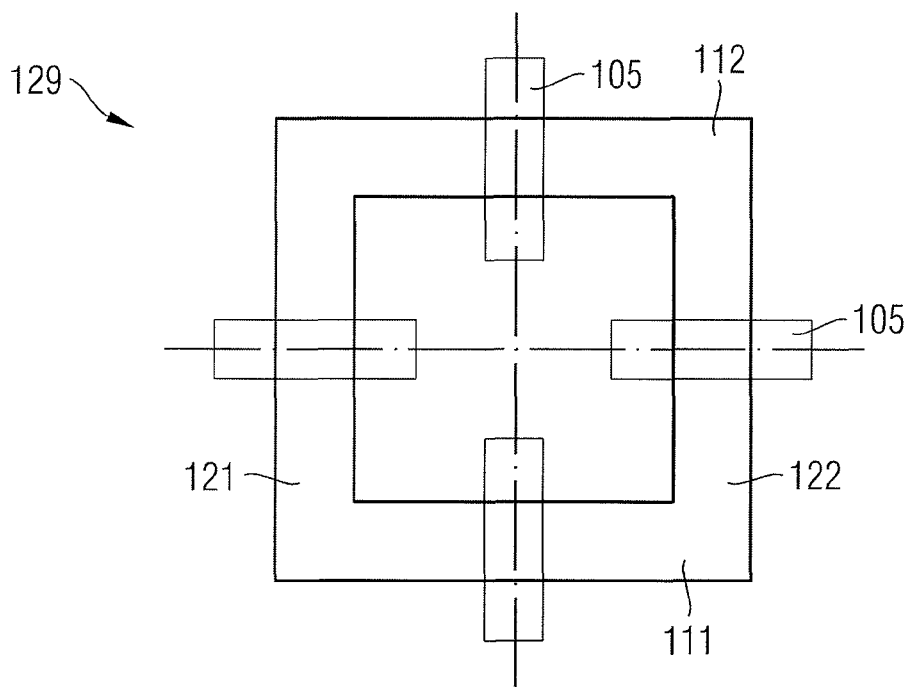
FIG. 1C is a plan view of a box-shaped registration mark according to another embodiment.

FIG. 1C refers to a further registration mark 129, which comprises two first line elements 111, 112 and two second line elements 121, 122 that form a rectangle or a square. The evaluation regions 105 may be placed along the symmetry axes of the registration mark 129.

According to other embodiments, the line elements of the registration marks may be bowed or may form circles or rings. In accordance with further embodiments, registration marks may comprise triangles, diamonds, multiple squares or a box within a box, a circle within a circle, a ring within a ring or a collection of bars and frames. In general, a registration mark may include a line element or a section of a line element having a width along a first axis and a second line element or a second section of a line element having a second width along an axis that intersects the first axis. In accordance with exemplary embodiments, the registration marks have one axis or two axes of symmetry. Different types of registration marks may be combined with each other.

Figure 2A:
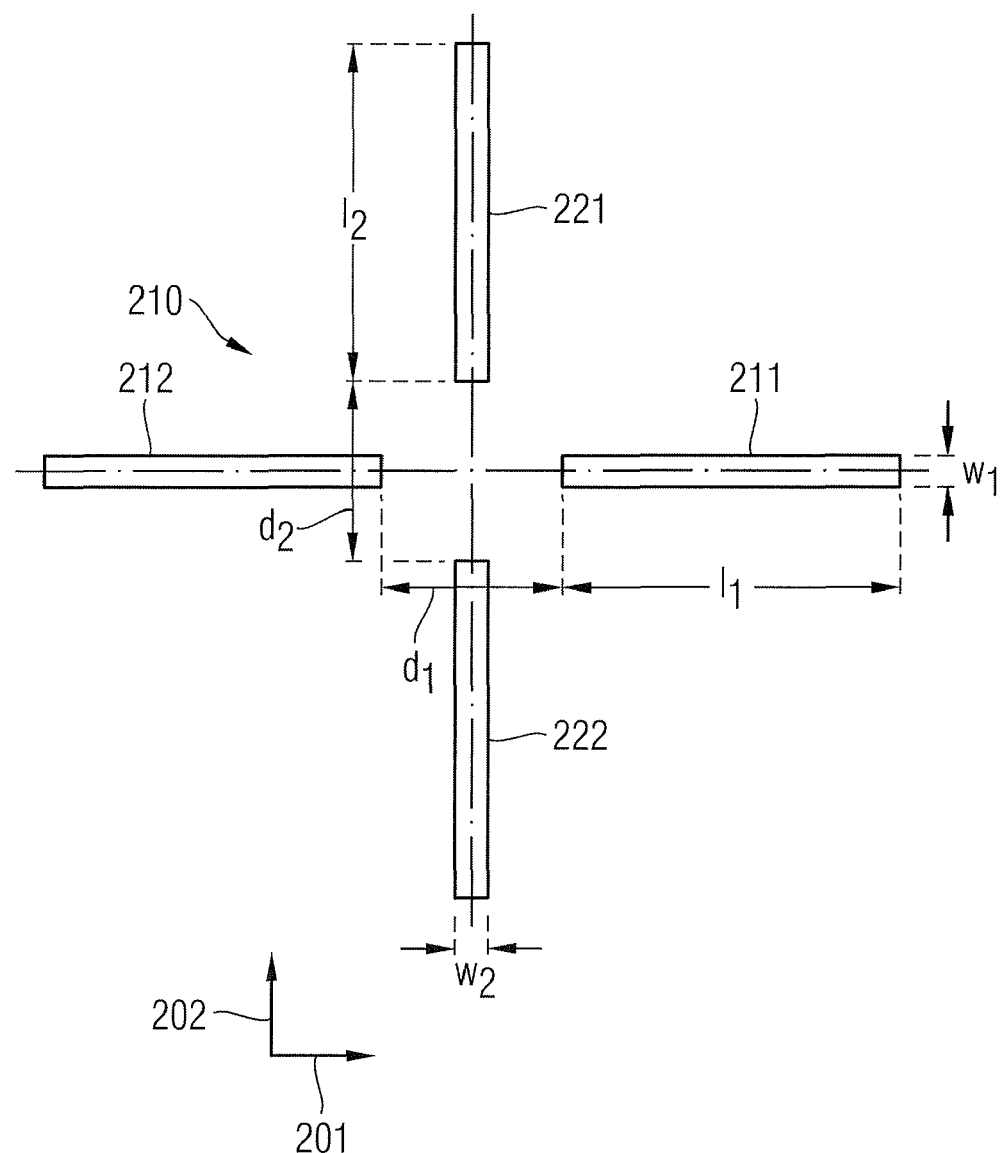
FIG. 2A is a schematic plan view of a registration mark comprising four line elements that form a cross according to a further embodiment.

FIG. 2A shows a further registration mark 210 for a mask used in a lithography apparatus with a nominal resolution limit. The registration mark 210 comprises a first line element 211, which may be a straight line extending along a first axis 201. The first line element 211 has a line length along the first axis 201 that is greater than the nominal resolution limit, for example between 10 μm and 30 μm, and a line width w1 that crosses the first axis 201 below the nominal resolution limit, for example between about 250 nm and about 400 nm at an illumination wavelength of 193 nm and a scale ratio of 4:1 between mask and wafer dimensions. The registration mark 210 comprises further a second line element 221, which is a straight line extending along a second axis 202 that intersects the first axis 201. In accordance with an embodiment, the second axis 202 is perpendicular to the first axis 201. The width w2 of the second line element 221 may be equal to the width w1 of the first line element 211. The length l2 of the second line element 221 may be equal to the length l1 of the first line element 211. The first and the second line elements 211, 221 are spaced apart from each other, for example, at a distance that is greater than the width w1 or greater than the nominal resolution limit of the lithography apparatus in which the mask comprising the registration mark 210 is used.

The first line element 211 and the second line element 221 may be arranged with respect to each other as illustrated in FIG. 2A. In accordance with further examples, the second line element 221 may be arranged along a symmetry axis of the first line element 211 along the second axis 202 to form a T-shaped registration mark. The registration mark 210 may comprise a further first line element 212 having the length l1 and the width w1 of the first line element 211 and a further second line element 222 having the length l2 and the width w2 of the second line element 221. The first line elements 211, 212 may be arranged along a line parallel to the first axis 201 and may be spaced at a distance d1. The second line elements 221, 222 may be arranged along a line parallel to the second axis 202 and may be spaced at a distance d2, wherein the distances d1 and d2 may be equal. The line elements 211, 212, 221, 222 may form a cross-shaped registration mark 210. The distances d1, d2 may be 5 to 15 times the width w1, for example 2.4 μm at a width w1 of 250 nm.

FIG. 2B refers to a pattern region of a mask 200 comprising a plurality of chip regions 208. The chip regions 208 may be separated by kerf regions 231 and spine regions 232 along a first axis and by kerf regions 231a and belt regions 233 along a second axis. The kerf, belt and spine regions 231, 232, 233 correspond to kerfs, spines and belts on a workpiece to which the pattern of the mask 200 is transferred. Along the kerfs, the wafer may be sawed to isolate individual chips. The kerfs may comprise support structures, for example printed registration marks, alignment marks or test circuitry for wafer level tests.

The mask 200 may further comprise a plurality of registration marks that may be arranged in the kerf regions 231, the spine regions 232 and/or the belt regions 233. The crosses depicted in FIG. 2B refer to the positions 210a of the registration marks, as the dimensions of the registration marks are smaller than the structures of the chip regions 208. Since the registration marks are not printed on the wafer, falling lines, particles contamination and other detrimental effects, which may occur on wafer level when using standard alignment marks, may be avoided to a high degree. Due to their small size, the sub-resolution registration marks can be applied in high numbers on the mask without any substantial impact on the process window. Therefore, the impact on the yield is low. Further, the registration marks may be placed anywhere on the mask, for example in the kerf region 231, the belt region 233, the spine region 232 or in idle areas within the chip regions 208. The resolution of the mask measurement or mask survey is improved. Amount and direction of deviations in the mask pattern may be determined at a high resolution facilitating a prediction of mask induced displacement of patterns on the workpiece. The mask fabrication process may be qualified more precisely. Pattern depended systematic displacement may be analyzed and either fed back in the mask fabrication process or fed forward in the process of fabricating integrated circuit.

Figure 2C:
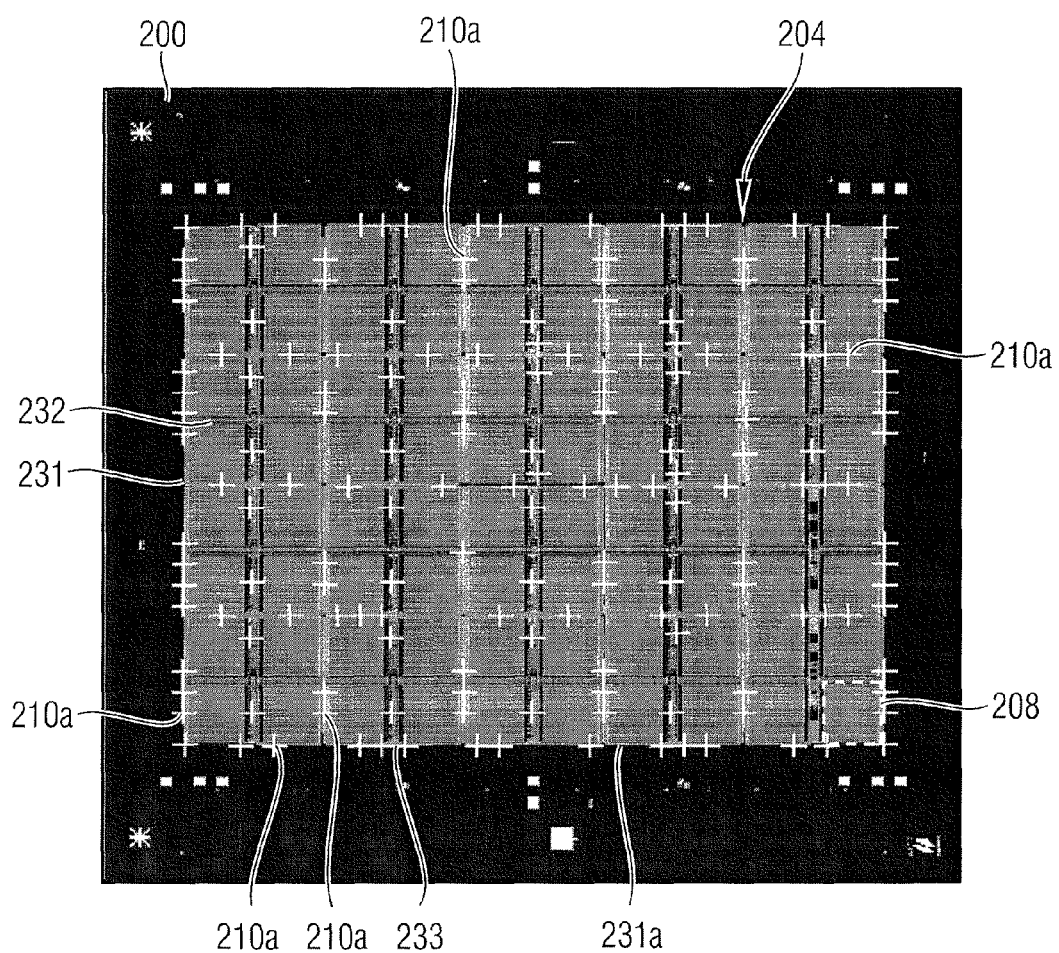
FIG. 2C is a schematic plan view of the mask shown in FIG. 2B.

FIG. 2C illustrates the mask 200, a section of which is illustrated in FIG. 2B. A plurality of positions 210a for registration marks is illustrated, wherein, according to the illustrated example, 150 to 250 registration marks may be distributed in a pattern region 204 of the mask 200. The registration marks at the positions 210a may have any shape described above and different types of registration marks may be combined.

Figure 2D:
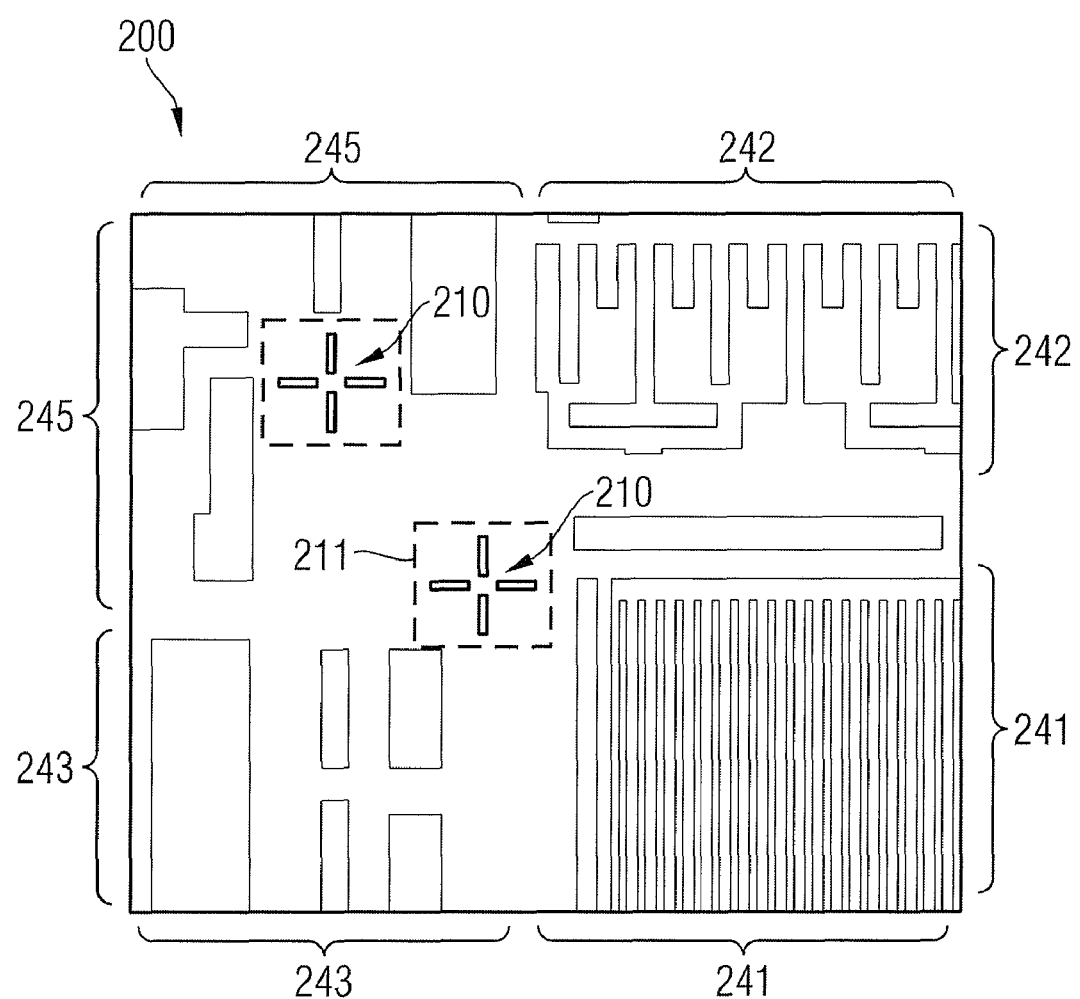
FIG. 2D is a schematic plan view of a mask comprising cross-shaped registration marks with four line elements that form a cross and that are arranged within a chip area of a mask according to a further embodiment.

FIG. 2D shows a detail of a chip region 208 of the mask 200 as shown in FIG. 2C. The chip region 208 may comprise densely patterned sections 241 and sections 245 with few patterns (idle regions). Placing the registration marks 210 close to the densely patterned sections 241 may allow an evaluation of a pattern dependent displacement in the mask and/or the evaluation of the displacement of fine structures that determine the overlay tolerance. The registration marks 210 may be provided in an idle area within the chip region 208 and keep a sufficient distance to the patterned sections 241, 243, 242. The distance is sufficient to avoid proximity effects between the line elements of the registration marks 210 and pattern elements of the neighboring patterned sections. Cross-shaped registration marks 210 as shown in FIG. 2D may be disposed closer to the patterned sections as proximity effects are comparable low at the narrow line ends. According to an exemplary embodiment, the registration marks 210 are arranged within the chip pattern 208 such that spacing areas 211 in which proximity effects due to the registration marks 210 may occur, do not overlap with the image patterns.

The densely patterned section 241 may correspond, for example, to active areas of a memory cell array. The lines of the densely patterned section 241 may, for example, be arranged at a sub-lithographic pitch by using optical proximity effects. A second section 242 may correspond, for example, to active areas of a sense amplifier stage assigned to the memory cell array. A third section 243 may correspond, for example, to a portion of a wordline driver circuitry assigned to the memory cell array. The transistors formed in the active areas of the memory cell array corresponding to the densely patterned section 241 may be connected to the sense amplifier stages. A mask for patterning, for example, bit line contacts or bitlines connecting the transistors of the memory cell array to the transistors of the sense amplifier stages shall typically be aligned to the active areas at a close tolerance.

By providing a registration mark 210 in close vicinity to the densely patterned section 241, for example both in the active area mask and in the bit contact/bit line mask, a mask induced portion of the displacement of the two patterns may be evaluated very precisely.

With reference to FIG. 3A, the allowable width for the sub-resolution registration marks may be determined in dependence on the exposure dose D of a half tone phase shift mask at an illumination wavelength of 193 nm. The region 301 refers to combinations of line widths w and exposure doses D that are not printed at the illumination wavelength in a typical resist material within a typical defocus range. For example, at an exposure dose of 22 mJ/cm$^2$, a line element on the mask with a width of about 280 nm is not printed on the workpiece, provided that the lithography process scales down the mask dimensions at a factor 4. The region 303 refers to combinations of line width and exposure dose which may be reliable printed and the region 302 refers to a transition region assigned to combinations of line widths and exposure doses resulting in a significantly reduced feature size.

Figure 3B:
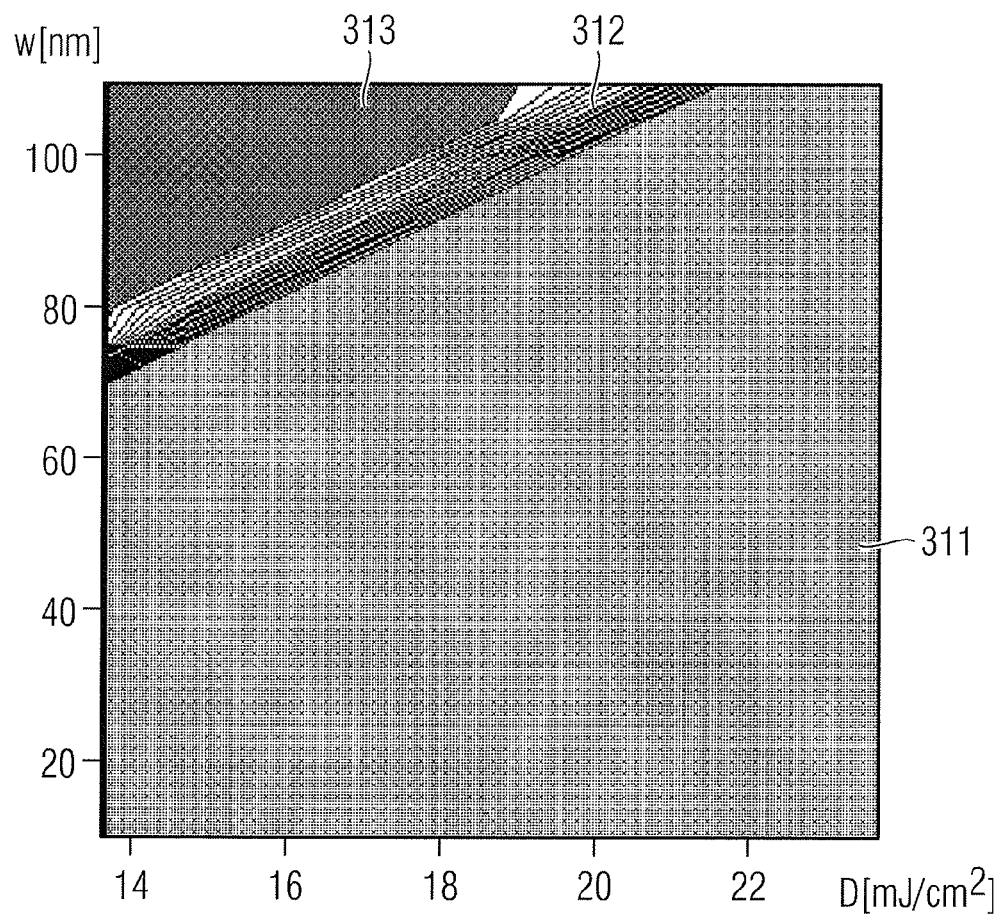
FIG. 3B is a further diagram for illustrating the illumination conditions for sub-resolution registration marks for chromium-based masks.

FIG. 3B refers to a further diagram illustrating a region 311 of combinations of line widths w and exposure doses D for a mask comprising opaque chromium-based structures on a quartz substrate. For example, at an exposure dose of 16 mJ/cm2 line elements on the mask with a width of less than 280 nm are not printed on the wafer, whereas the same exposure dose prints a feature with a line width of 400 nm, according to region 313 and provided that the lithography process scales down the mask dimensions at a factor 4. Region 312 refers to a transition region identifying combinations resulting in very thin resist features that may peel away from an underlayer.

Figure 4A:
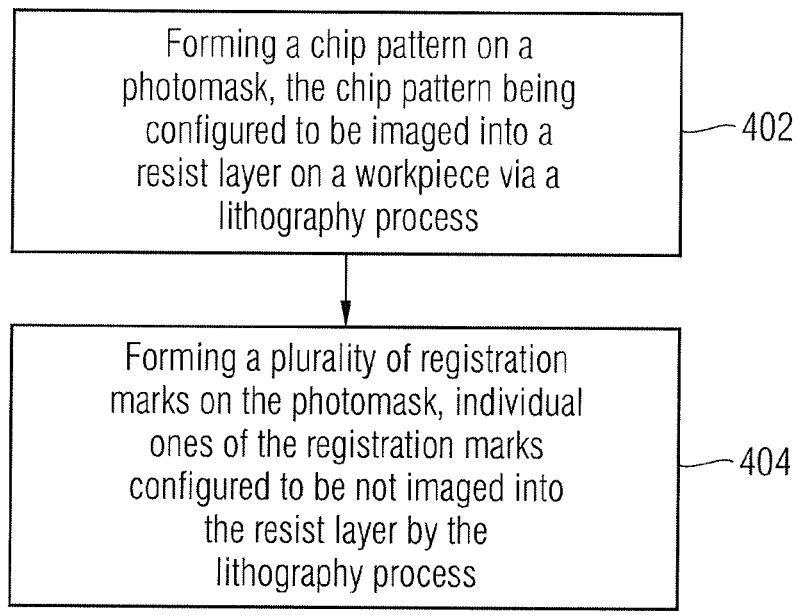
FIG. 4A is a flow-chart illustrating a method of fabricating a mask according to a further embodiment.

FIG. 4A refers to a flow-chart of an exemplary embodiment of a method of fabricating photomasks. A chip pattern is formed on the photomask, wherein the chip pattern is configured to be imaged into a resist layer, which is disposed on a workpiece, via a lithography process (402). Further a plurality of registration marks is formed on the photomask, wherein individual ones of the registration marks are configured not to be imaged into the resist layer by the same lithography process (404). The position of the registration marks on the photomask may be measured with reference to a point of reference via optical image detection methods.

In accordance with an embodiment of the invention, the positions of the registration marks are evaluated with reference to an allowable deviation from a respective target value. If the displacement of, for example, one or more critical registration marks, assigned, for example to a densely patterned region, deviates more than allowable from the target value, the photomask may be discarded or reworked.

In accordance with a further embodiment, the chip pattern and the registration marks are formed by depositing a first layer on a carrier substrate of the photomask and then forming a resist layer on the first layer. The resist layer may be patterned, for example, by electron beam writing or another particle write beam. The resist layer may then comprise both a pattern corresponding to the chip pattern and a pattern corresponding to the registration marks. The pattern of the resist layer is transferred into the first layer to form the chip pattern and the registration marks on the photomask.

Figure 4B:
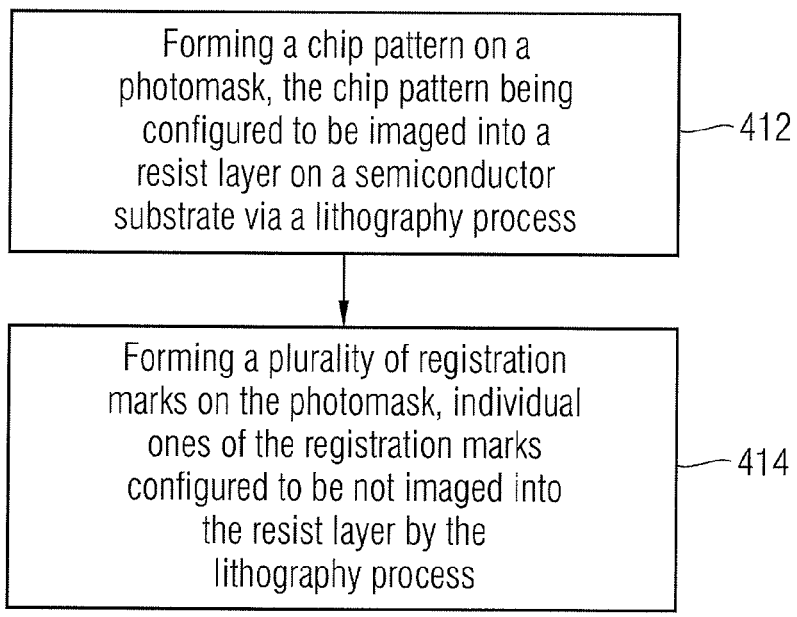
FIG. 4B is a further flow-chart illustrating a method of fabricating an integrated circuit according to yet another embodiment.

The flow-chart of FIG. 4B refers to a method of fabricating integrated circuits. Chip patterns and a plurality of registration marks are formed on a mask, which is for example a transparent or a reflective mask, wherein the chip pattern is configured to be imaged into a resist layer on a semiconductor substrate via a lithography process (412). Individual ones of the registration marks are configured not to be imaged into the resist layer by the same lithography process (414). The position of the registration marks may be measured with reference to a point of reference using for example, an optical image detection method. The positions or the displacement of the registration marks may be evaluated with reference to an allowable deviation from a respective target value. Only masks, the registration marks of which meet the allowable deviation are used for the lithography process. A first class of registration marks assigned to critical, densely patterned regions may have a smaller allowable deviation range than uncritical registration marks assigned, for example, to non-critical portions of the mask. The mask information (i.e., mask data) containing the displacement information may be fed forward into the process flow for the integrated circuit to adapt process parameters in a subsequent process. For example, a parameter of a following lithography process may be adapted in dependence on the mask information.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A photomask configured to be used in a lithography apparatus, the photomask comprising:
    a chip pattern configured to be transferred into a resist layer on a workpiece by the lithography apparatus; and
    a registration mark configured not to be transferred into the resist layer, wherein the registration mark comprises a first line element configured to qualify the photomask, the first line element including:
        a line width below a nominal resolution limit of the pattern transfer lithography apparatus; and
        a line length extending along a first axis, the line length of the first line element being greater than the nominal resolution limit.

2. The photomask of claim 1, wherein the first line element extends in a straight line along the first axis.

3. The photomask of claim 2, wherein the registration mark further comprises a second line element with a width below the nominal resolution limit and a length greater than the nominal resolution limit, the second line element extending in a straight line along a second axis that intersects the first axis.

4. The photomask of claim 3, wherein the registration mark further comprises at least one further first line element extending along the first axis and at least one further second line element extending along the second axis.

5. The photomask of claim 4, wherein the line elements are arranged to form a cross or a rectangle.

6. The photomask of claim 5, wherein the line elements are spaced apart from each other.

7. The photomask of claim 1, further comprising:
    a plurality of registration marks, wherein individual ones of the registration marks comprise at least one line element with a width below the nominal resolution limit.

8. The photomask of claim 7, further comprising:
    a chip pattern comprising dense and less dense functional areas or idle areas, wherein individual ones of the registration marks are arranged within at least one of the less dense functional areas or idle areas.

9. The photomask of claim 7, further comprising:
    a plurality of chip patterns separated by kerf regions, wherein individual ones of the registration marks are arranged within the kerf regions.

10. The photomask of claim 7, further comprising:
    a plurality of chip patterns separated by test circuit pattern stripes, wherein individual ones of the registration marks are arranged within the test circuit pattern stripes.

11. The photomask of claim 1, wherein the line width of the first line element is between about 250 nm and 400 nm.

12. The photomask of claim 1, wherein the first line element is one of a plurality of first line elements whose widths are below the nominal resolution limit and whose lengths extend along a first axis, the lengths of the first line elements being greater than the nominal resolution limit, the photomask further comprising:
    a plurality of second line elements whose widths are below the nominal resolution limit and whose lengths extend along a second axis that intersects the first axis, the lengths of the second line elements being greater than the nominal resolution limit.

13. A photomask configured to be used in a pattern transfer lithography apparatus with a nominal resolution limit, the photomask comprising:
    a registration mark comprising a first line element configured to qualify the photomask, the first line element including:
        a line width below the nominal resolution limit; and
        a line length extending along a first axis, the line length of the first line element being greater than the nominal resolution limit.

14. The photomask of claim 13, wherein the first line element is a straight line extending along the first axis.

15. The photomask of claim 14, wherein the registration mark further comprises:
    a second line element with a width below the nominal resolution limit, the second line element extending in a straight line along a second axis that intersects the first axis.

16. A method of fabricating photomasks, the method comprising:
    forming a chip pattern on a photomask, the chip pattern being configured to be imaged into a resist layer on a workpiece via a lithography process; and
    forming a plurality of registration marks on the photomask, individual ones of the registration marks being configured not to be imaged into the resist layer by the lithography process, wherein the individual ones of the registration marks each comprise a first line element configured to qualify the photomask, the first line element including:
        a line width below a nominal resolution limit of the pattern transfer lithography apparatus; and
        a line length extending along a first axis, the line length of the first line element being greater than the nominal resolution limit.

17. The method of claim 16, further comprising:
    measuring, via an optical image detection method, the positions of the registration marks with reference to a point of reference.

18. The method of claim 17, further comprising
    evaluating the positions with reference to an allowable deviation from a respective target value; and
    discarding or reworking photomasks exceeding the allowable deviation.

19. The method of claim 16, wherein forming the chip pattern and forming the registration marks comprises:
    providing a first layer on a carrier substrate of the photomask;
    providing a resist layer on the first layer;
    patterning the resist layer; and transferring the pattern of the resist layer into the first layer to form the chip pattern and the registration marks.

20. A method of fabricating integrated circuits, the method comprising:
forming a chip pattern on a photomask, the chip pattern being configured to be imaged into a resist layer on a semiconductor substrate via a lithography process; and
forming a plurality of registration marks on the photomask, individual ones of the registration marks being configured not to be imaged into the resist layer by the lithography process, wherein the individual ones of the registration marks each comprise a first line element configured to qualify the photomask, the first line element including:
a line width below a nominal resolution limit of the pattern transfer lithography apparatus; and
a line length extending along a first axis, the line length of the first line element being greater than the nominal resolution limit.

21. The method of claim 20, further comprising:
measuring, via an optical image detection method, the positions of the registration marks with reference to a point of reference.

22. The method of claim 21, further comprising:
evaluating the positions with reference to an allowable deviation from a respective target value; and
using photomasks with the registration marks having positions evaluated as being within the allowable deviation for the lithography process.

23. The method of claim 22, further comprising:
using mask data comprising information about deviations from the target values to adapt a process parameter in a subsequent process.

24. The method of claim 23, wherein the process parameter in the subsequent process is a parameter of a lithography process.

\* \* \* \* \*